United States Patent
Weber et al.

(10) Patent No.: US 10,498,340 B2
(45) Date of Patent: Dec. 3, 2019

(54) FIELD PROGRAMMABLE GATE ARRAY COMPRISING PLURALITY OF FUNCTIONAL BLOCKS, AND CONTROL DEVICE FOR A POWER PLANT

(71) Applicant: AREVA NP, Courbevoie (FR)

(72) Inventors: Johannes Weber, Poing (DE); Burkhardt Möller, Offenbach (DE)

(73) Assignee: AREVA NP, Courbevoie (FR)

( * ) Notice: Subject to any disclaimer, the term of this patent is extended or adjusted under 35 U.S.C. 154(b) by 86 days.

(21) Appl. No.: 15/736,689

(22) PCT Filed: Jun. 13, 2016

(86) PCT No.: PCT/EP2016/063482
§ 371 (c)(1),
(2) Date: Dec. 14, 2017

(87) PCT Pub. No.: WO2016/202734
PCT Pub. Date: Dec. 22, 2016

(65) Prior Publication Data
US 2018/0191352 A1 Jul. 5, 2018

(30) Foreign Application Priority Data
Jun. 16, 2015 (EP) ..................... 15305932

(51) Int. Cl.
*H03K 19/177* (2006.01)
*G05B 19/05* (2006.01)
*H03K 19/20* (2006.01)

(52) U.S. Cl.
CPC ....... *H03K 19/17748* (2013.01); *G05B 19/05* (2013.01); *H03K 19/17724* (2013.01); *G05B 2219/161* (2013.01); *H03K 19/20* (2013.01)

(58) Field of Classification Search
CPC ....... H03K 19/17748; H03K 19/17724; H03K 19/17732; H03K 19/17792; H03K 19/20; G05B 19/05; G05B 2219/161
(Continued)

(56) References Cited

U.S. PATENT DOCUMENTS

2005/0121789 A1* 6/2005 Madurawe .......... H01L 27/0207
257/758
2006/0064292 A1 3/2006 Clune
(Continued)

OTHER PUBLICATIONS

Extended European Search Report issued for European Application No. 15305932 dated Dec. 22, 2015.
(Continued)

*Primary Examiner* — Don P Le
(74) *Attorney, Agent, or Firm* — Pearne & Gordon LLP (57) ABSTRACT

A field programmable gate array comprising: plurality of functional blocks at least one of the functional blocks comprising at least one function, at least one of the functions using a parameter, wherein the functional blocks are adapted to perform the at least one function in a calculation phase; a data conveyor comprising a plurality of data slots, wherein each functional block is, in a data transfer phase, adapted to receive input data from one or more predefined first slots and/or to provide output data into one or more predefined second slots; and a configuration circuit adapted to configure the parameter for the at least function using the parameter and to define the one or more first slots and/or the one or more second slots for at least one functional block, wherein the field programmable gate array is adapted to cyclically repeat the data transfer phase and calculation phase.

14 Claims, 5 Drawing Sheets

(58) Field of Classification Search
USPC .......................................................... 326/41
See application file for complete search history.

(56) References Cited

U.S. PATENT DOCUMENTS

2006/0112382 A1    5/2006  Glass
2008/0265937 A1*  10/2008  Sima ................ H03K 19/17736
                                                      326/41
2013/0049803 A1    2/2013  Asakura

OTHER PUBLICATIONS

International Search Report issued for International Application No. PCT/EP2016/063482 dated Aug. 23, 2016.

* cited by examiner

FIELD PROGRAMMABLE GATE ARRAY COMPRISING PLURALITY OF FUNCTIONAL BLOCKS, AND CONTROL DEVICE FOR A POWER PLANT

This application is a National Stage application of PCT International Application No. PCT/EP2016/063482, filed on Jun. 13, 2016 which claims the priority of European Patent Application No. 15305932.4, filed on Jun. 16, 2015, both of which are incorporated herein by reference in their entirety.

The present invention concerns a field programmable gate array comprising plurality of functional blocks at least one of the functional blocks comprising at least one function, at least one of the functions using a parameter, wherein the functional blocks are adapted to perform the at least one function in a calculation phase.

Further, the present invention relates to a control device for a power plant, in particular a nuclear power plant, wherein the control device includes such a field programmable gate array.

WO 2008/138420 A1 discloses a device for the dynamic reconfiguration of a radio communications system. The device comprises functional blocks which may be reprogrammed to switch from a transmission mode to a receiving mode or vice versa.

In the nuclear industry, project specific engineering tasks currently are performed using CPU based instrumentation and control platforms with the help of signal flow oriented human readable diagrams, for example based on IEC 61131 function block diagrams (FBDs). A toolchain automatically translates these diagrams into C-code that can be compiled and run on a CPU based safety instrumentation and control system. The binary result of the whole tool chain is highly predictable, so that the methodology can be qualified for safety applications.

However, for field programmable gate arrays (FPGA), due to the nature of FPGAs and their toolchains even small changes on the design entry level may lead to previously unpredictable, completely different timing characteristics of the final chip. Therefore, FPGAs are rarely used in the safety instrumentation and control industry using a diagram based approach. Instead electronics experts are needed to do the FPGA design using well known techniques based on hardware description languages such as VHDL (very high speed integrated circuit hardware description language). This leads to fixed designs, which may be reused under different circumstances only by performing very complex project engineering tasks involving specialists not only from the application domain but also from the FPGA design domain.

Furthermore, every FPGA design needs to be qualified very carefully by employing complex development and verification processes. Typically, a qualification of an FPGA needs a lot of effort.

Object of the invention is to provide a field programmable gate array that enables proven diagram centric project specific engineering approach while still providing the benefits of FPGA technology.

In light of the above, the field programmable gate array comprising:
plurality of functional blocks at least one of the functional blocks comprising at least one function, at least one of the functions using a parameter, wherein the functional blocks are adapted to perform the at least one function in a calculation phase;
a data conveyor comprising a plurality of data slots, wherein each functional block is, in a data transfer phase, adapted to receive input data from one or more predefined first slots and/or to provide output data into one or more predefined second slots; and
a configuration circuit adapted to configure the parameter for the at least function using the parameter and to define the one or more first slots and/or the one or more second slots for at least one functional block, wherein
the field programmable gate array is adapted to cyclically repeat the data transfer phase and calculation phase.

According to further embodiments, the invention may include one or more of the following features in any technical possible combination:
  the configuration circuit is adapted to define the one or more first slots and/or the one or more second slots of a plurality, in particular all functional blocks;
  at least one functional block is adapted to receive input data from at least two first slots or to provide output data into at least two second slots, wherein at least two slots of the first slots or the second slots are not adjacent to each other;
  at least one functional block is adapted to receive as input data output data of at least two functional blocks;
  the first and/or second slots are time slots, and/or the functional blocks are, in at least two subsequent data transfer phases, for example all data transfer phases, adapted to receiving input data respectively from the same one or more predefined first slots and/or providing output data into respectively the same one or more predefined second slots.
  the data conveyor includes a multiplexer and/or includes a central element of a distributed multiplexer structure;
  the data conveyor includes at least one OR gate having a plurality of input ports, wherein the output port of a plurality of a functional blocks is connected to the input ports of the OR gate;
  each functional block includes at least one data inbox, in particular as input shift register, for the input data and/or at least one data outbox, in particular as an output shift register, for the output data;
  at least one function of the functional blocks is adapted to read the at least one input data, in particular from the data inbox, to perform a task on the at least one input data, and to provide the result of the task as the at least one output data, in particular in the data outbox;
  the at least one function an binary function for binary logic operations, a compare function, a voting function, a calculation function and/or a binary memory;
  the field programmable gate array is adapted to perform the at least one function of all functional blocks concurrently;
  at least one functional block, in particular a plurality of functional blocks, is a or are input block(s), wherein each input block is adapted to receive data from devices external to the field programmable gate array and to extract the data for at least one functional block performing a function, and wherein at least one functional block, in particular a plurality of functional blocks, is a or are output block(s) adapted to transform output data from at least one functional block performing a function for devices external to the field programmable gate array; and/or
  the configuration circuit is adapted to retrieve the configuration data from an external memory being external to the field programmable gate array.

According to another aspect, a control device for a power plant, in particular a nuclear power plant, wherein the control device includes a field programmable gate array according to embodiments disclosed herein.

Using the FPGA design according to the invention results in significantly lower engineering costs compared using individually programmed FPGAs. In particular, FPGA based devices which may be programmed using diagram centric programming may be used in a power plant, in particular a nuclear power plant.

In particular in contrast to typical FPGA use cases, the flexibility of the circuit is reduced, but still great enough to adapt the FPGA to a specific project in the domain of power plants, in particular nuclear power plants, instrumentation and control systems. For a field programmable gate array according to the invention, the qualifying effort is substantially reduced as it may be done before configuring the FPGA for a specific project.

According to the invention, the FPGA implements a plurality of functional blocks, which may be connected in a configurable way to each other according to the project, for example via a time multiplexing circuit using fixed (configurable) slots for the input and output of each functional block. However, this adapting of the FPGA does not need a modification of the basic circuit based on VHDL. In other words, the FPGA circuits may be qualified, and the detailed configuration may be performed in each project. The FPGA may include a superset of all logic blocks needed for different projects.

According to an embodiment, a small configuration circuit or memory may adapt individually each functional block as specified for a respective project.

Further advantages, features, aspects and details are evident from the dependent claims, the description and the drawings.

So that the manner in which the above recited features of the present invention can be understood in detail, a more particular description of the invention, briefly summarized above, may be read by reference to embodiments. The accompanying drawings relate to embodiments of the invention and are described in the following.

It is contemplated that elements of one embodiment may be advantageously utilized in other embodiments without further recitation.

Figure 1:
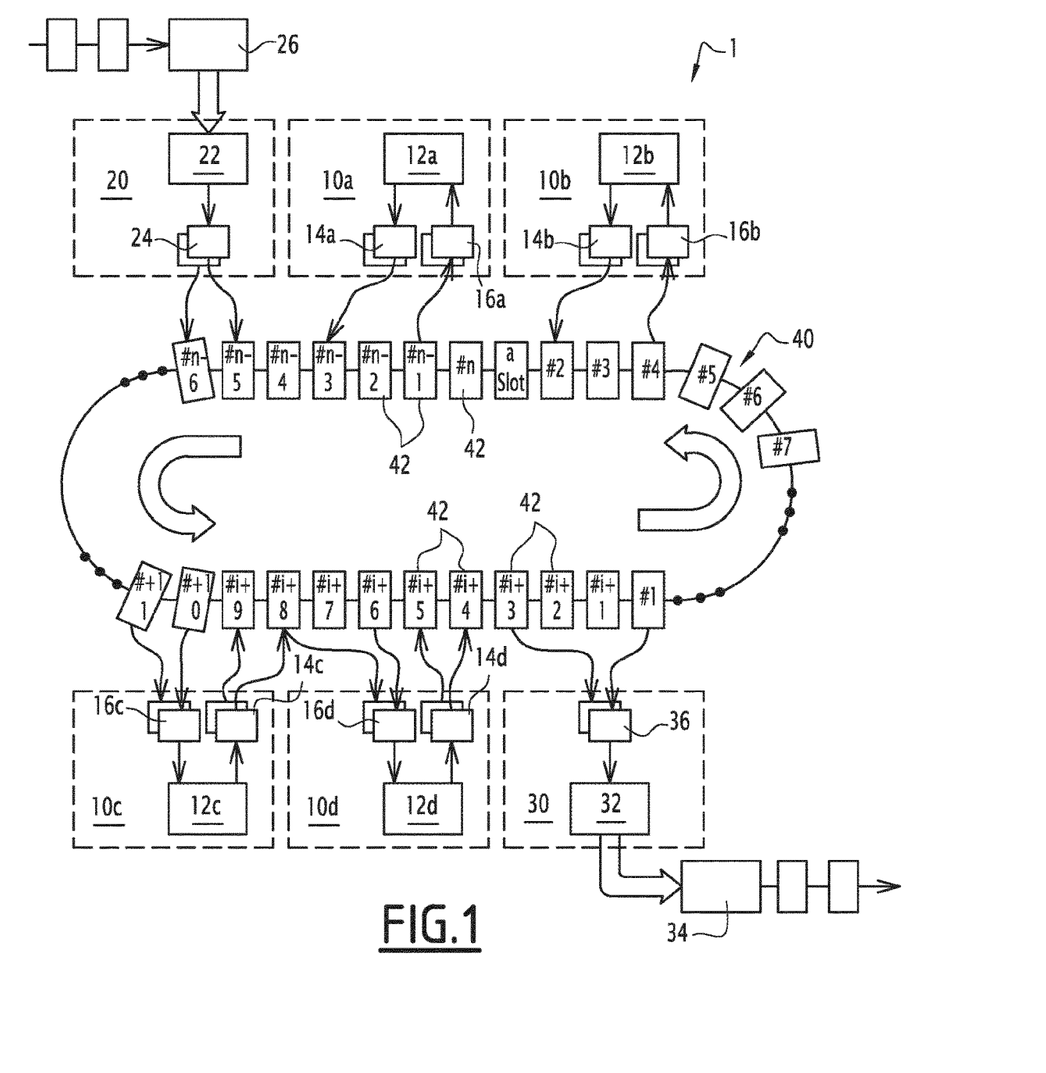
FIG. 1 shows schematically a flow chart of an embodiment of an FPGA according to the invention.

FIG. 1 shows a schematic flow chart of an embodiment of an FPGA (field programmable gate array) 1 according to the invention.

The FPGA 1 includes a plurality of functional blocks 10a, 10b, 10c, 10d. Further, the FPGA 1 includes specific functional blocks, namely an input block 20 and an output block 30. Each functional block 10a-d, the input block 20 and the output block 30 includes at least one function or operator 12a, 12b, 12c, 12d, 22, 32 to be performed on data received.

The functional blocks 10a-d may implement instrumentation and control related functions, such as voting 2oo4 digital input signals, one or more digital gates (AND, OR, etc), one or more floating point units performing calculations such as a square root or logarithm, one or more threshold comparators or calculations steps as a function 12a-d.

The function or operator 12a-d are provided as a hard coded circuit in the FPGA 1. Each function 12a-d is adapted to calculate one or more output data from one or more input data. The output data of the functional blocks 10a-d is provided to one or more data outboxes 14a, 14b, 14c, 14d. The input data of the functional blocks 10a-d is received or read from one or more data inboxes 16a, 16b, 16c, 16d.

The input block 20 is, according to an embodiment, connected to a first external communication line 26, which is external to the FPGA 1 and which provides data to be treated to the FPGA 1. The data may be provided in an arbitrary protocol or it may be even represent analogue data.

According to an embodiment, the input block 20 may comprise as a function or operator 22 a converter to convert the format from the first external communication line 26 to the internal data format that are used by the functional blocks 10a-d. For example, the converter may be a converter to extract data received from an optical fiber or from a bus, or from different input formats or protocols, so that the data can be treated by the functional blocks 10a-d. The converted data is put into at least one data outbox 24.

The output block 30 provides the output data read from at least one inbox 36 to a second external communication line 34, which is external to the FPGA. For example, the second external communication line may be a specific bus, for example an optical fiber. In other embodiment, the second external communication line 34 may be an analog connection. In other embodiments it is a binary connection. Thus, the output block 30 may comprise as a function or operator 32 a converter to convert the data from the internal data format to a data suitable for the first external communication line 34. For example, the function 32 may include a packaging function for a specific protocol.

Further, the FPGA 1 includes a data conveyor 40. According to an embodiment, which may be combined with other embodiments disclosed herein, the data conveyor includes a plurality of slots 42. The number of slots is for example at least 256 for example between 512 and 4096. Each slot 42 may convey one or more bits. According to an embodiment, the data conveyor includes at least two groups of slots. A first group of slots, for example between 512 to 4096 slots, are binary value slots and a second group of slots, for example 64 to 2048 slots, are analog value slots. The analog value slots may have a width of at least 32 bits. The binary value slots may have a width of one or two bits.

Each functional block 10a-d and the output block 30 is configured to receive or to read, during at least one first processing period, data from one or more predefined slots 42 into their respective one or more inboxes 16a-d, 36.

Each functional block 10a-d and the input block 20 is configured to provide, during at least one second processing period, data from their one or more outboxes 14a-d, 24 into one or more predefined slots 42 of the data conveyor 40.

Thus, each functional block 10a-d, the input block 20 and the output block 30 are adapted to receive input data, respectively to provide output data into a plurality of slots 42 of the data conveyor 40 according to their respective parametrization or configuration. In other words, any functional block 10a-d, 20, 30 can be configured to use any slot of the data conveyor 40 for the input data or output data.

In other embodiments, the operation to provide the data to the one or more predefined slots and to read the data from the one or more predefined slots 42 may in a combined first and second processing period, which may be further divided in sub-periods.

According to an embodiment, the performing of the calculations on the data in the functions 12a-d, 22, 32 are performed in parallel. For example, the calculations in the functions 12a-d, 22, 32 are performed in a third processing period.

The first, second (or combined first and second) processing period and the third processing period are repeated in the same manner. In every first, second combined first and second and third processing period, the functional blocks perform the same operations, only using different values, which are provided or stored in the respective slots.

For example, the data conveyor providing a number of slots 42 is written and read in a strictly timed manner according to a central configuration. In other words, it is centrally determined, when the data exchange between the data conveyor 40 and the inboxes 16a-d, 36 and outboxes 14a-d, 24 take place and when the functions 12a-d, 22, 32 are performed in the functional blocks 10a-d, and in particular in the input block 20 and the output block 30. Therefore, there exist a data transfer phase, which includes the at least one first and second processing period, and a calculation phase, which includes the third processing period. According to an embodiment, the transfer phase and the calculation phase are alternatingly performed in the FPGA 1.

According to an embodiment, a configuration circuit (not shown in FIG. 1) is adapted to set the parameters in the respective functional blocks 10a-d the output block 20 and the input block 30. For example, the configuration circuit is adapted to parameterize the functions of the functional blocks 10a-d according to a predefined set of parameters, such as, for example threshold values for a threshold comparator. Further, the configuration circuit is adapted to define or set the slots 42 for the output data for each functional block 10a-d, 20, 30. In other words, the configuration circuit is adapted to store and to set the assignment of outboxes 14a-d, 24 to the respective slots 42 of the data conveyor and the assignment of the slots 42 to the respective inboxes 16a-d, 36.

For example, the configuration circuit is adapted to read from a memory, for example a non-volatile memory, the configuration parameters, which include the parameter for the functions 12a-d, 22, 32 and the assignments of the input data or data inboxes and output data or data outboxes to the slots 42 of the data conveyor 40.

Thus, during a project, only the configuration parameters have to be modified, whereas the FPGA remains unchanged, as well as the circuit in VHDL.

According to an embodiment, if a functional block 10a-d is not needed for a specific project it is statically disabled to access the data conveyor 40. For example an AND gate may be used for that purpose.

Figure 2:
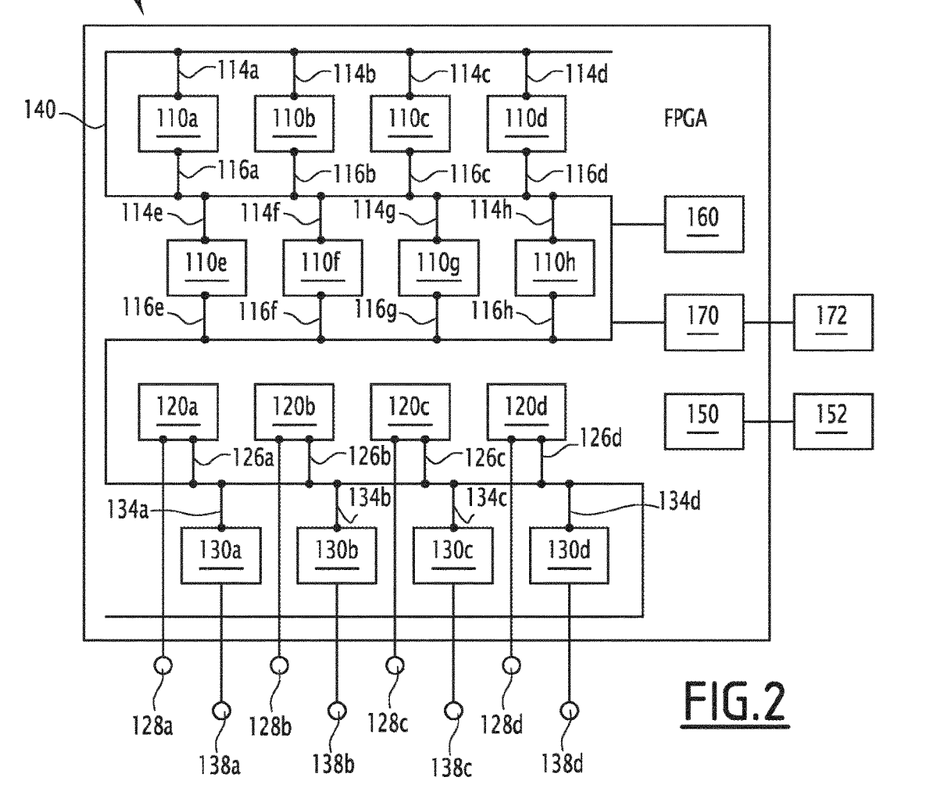
FIG. 2 shows a schematic block diagram of an embodiment of an FPGA according to the invention.

FIG. 2 shows an embodiment of an FPGA 100, in which a data conveyor 140 is represented in a different manner. The same features are provided with the same reference signs as in FIG. 1 increased by 100 unless designated otherwise. The features of embodiment of FIG. 2 may be combined with other embodiments disclosed herein. FIG. 2 shows a possible spatial distribution of the different blocks in the FPGA 100.

The FPGA 100 includes a plurality of functional blocks 110a-h. However, it should be noted that the number of functional blocks is not limited to eight. The FPGA 100 may also include more or less functional blocks 110a-h. Each functional block 110a-h is connected with an input line 114a-h to the data conveyor or bus 140 to receive the input data. Further, each functional block 110a-h is provided with an output line 116a-h to the data conveyor 140 to provide output data to the data conveyor 140.

According to the embodiment shown in FIG. 2, the FPGA includes four input blocks 120a, 120b, 120c, 120d and four output blocks 130a, 130b, 130c, 130d. The number of input blocks and output blocks is in an embodiment identical. In other embodiments, the number of input blocks and output blocks may differ from each other. In another example, the FPGA 100 may include more or less than four input blocks and/or more or less than four output blocks.

Each input block 120a-d is provided with an output line 126a-d to provide data received from input pins 128a-d of the FPGA 100 to the data conveyor 140. For example, the data provided to the input pins 128a-d may come from another FPGA or from I/O modules. The input blocks 120a-d convert the data received from the input pins 128a-d for the usage in the data conveyor 140, for example as described here-above with respect to FIG. 1.

In the opposite manner, each output block 130a-d is provided with an input line 134a-d to receive data from the data conveyor 140. The data is transformed or converted to other formats or protocols, for example as described for the embodiment in FIG. 1, to provide it to the output pins 138a-d of the FPGA. The data may be then used by other external devices (not shown in FIG. 2), for example another FPGA.

In an embodiment, the FPGA 100 includes a configuration circuit 150. The configuration circuit is adapted to be connected to a configuration memory 152, for example a non-volatile memory 152. In an example, which may be combined with other embodiments disclosed herein, the configuration memory 152 is external to the FPGA 100.

The configuration circuit 150, is adapted to configure the parameters of all functional blocks 110a-h, the input blocks 120a-d and the output blocks 130a-d. For example, the configuration circuit 150 is adapted to provide the parameter of a function to be executed by one or more, in particular all, functional blocks 110a-h. In some embodiments, the configuration circuit 150 is adapted to assign the inboxes and outboxes of the functional blocks 110a-h, the input blocks 120a-d and the output blocks 130a-d to the respective slots of the data conveyor 140.

In an embodiment, all the parameters needed for the configuration of the FPGA 100 are usually stored in the configuration memory 152. The configuration circuit 150 is adapted to read the configuration memory 152 and subsequently set all the parameters in the functional blocks 110a-h, the input blocks 120a-d and the output blocks 130a-d. For example, the parameters stored in the configuration memory 152 may be also changed during runtime to change the parameters of the functional blocks 110a-h, 120a-d, 130a-d. For example, a threshold may change during runtime.

The FPGA 100 may further include a clock 160. According to an embodiment, the clock may provide a central time signal and may define the calculation and the data transfer phases, as discussed here-above. Typically, the latency is the same or at least a multiple of a fixed quantum for all functional blocks 110a-h. According to an embodiment, the clock 160 provides to each functional block 110a-h, the input blocks 120a-d and the output blocks 130a-d a time or clock signal.

According to an embodiment, the FPGA 100 includes a test logic 170. The test logic 170 is connected to a test pattern memory 172, which is external to the FPGA 100. The test pattern memory 172 stores test data, for example in the form of test vectors or test patterns.

Typically, in an embodiment, which may be combined with other embodiments disclosed herein, each functional block has its own resources, for example one or more memory elements, one or more logic operation units, and/or one or more floating point units, which are separated from the resources of the other functional blocks. For example, each functional block or function has its own memory elements or floating point units. However, it is not necessary the each functional block has all available resources. For example not every functional block may have a floating point unit. In other words, the functional blocks, the input block and the output block do not share resources to perform their tasks.

In the following, several embodiments of the data conveyor are disclosed.

Figure 3:
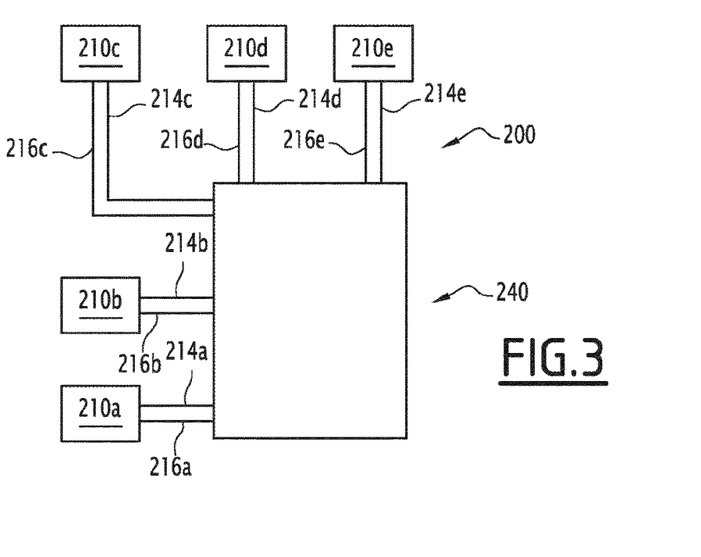
FIG. 3 shows a schematic block diagram of an embodiment of a data conveyor.

FIG. 3 shows an FPGA 200 including a first embodiment of a data conveyor 240. The same features are provided with the same reference signs as in FIG. 1 increased by 200 unless designated and described otherwise. The features of embodiment of FIG. 3 may be combined with other embodiments disclosed herein.

The FPGA 240 comprises a plurality of functional blocks 210a, 210b, 210c, 210d, 210e and a data conveyor 240. The data conveyor 240 is connected to each functional block 210a-e with an input line 214a-e and an output line 216a-e. The input line 214a-e and the output line 216a-e may have, for example, a data width of 32 bit. Also other data widths may be used. In some embodiments, every functional block 210a-e provides the output information in a serialized form. From the point of view of a functional block the data 240 conveyor behaves like a memory. The data conveyor 240 is configured to route the data to the correct input line 214a-e and receiving functional block 210a-e. Thus, every functional block 210a-e needs only to implement a simple memory interface. In this embodiment, there is no obligation to obey a strict and constant cycle time over the whole device.

Figure 4:
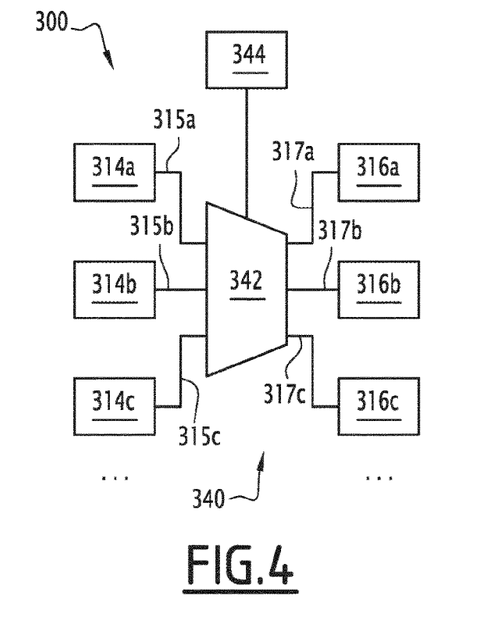
FIG. 4 shows a schematic block diagram of a further embodiment of a data conveyor.

FIG. 4 shows another FPGA 300 including a second embodiment of a data conveyor 340. The same features are provided with the same reference signs as in FIG. 1 increased by 300 unless designated and described otherwise. The features of embodiment of FIG. 4 may be combined with other embodiments disclosed herein.

The FPGA 300 includes a plurality of functional blocks, wherein each functional block includes a data outbox 314a, 314b, 314c and a data inbox 316a, 316b, 316c. In other embodiments, the FPGA 300 may include more or less functional blocks. For the sake of simplicity, the data outbox and the inbox for each functional block are shown on the left side and the right side respectively.

The data outboxes 314a-314c are connected with output lines 315a-c to the bus master 342, which in turn is connected with input lines 317a-c to the respective data inboxes 316a-c. For example, the input lines 317a-c and/or the output lines 315a-c may have a band width 8 bit. In other embodiments, the input lines 317a-c and/or the output lines 315a-c may have another band width.

The data conveyor 340 comprises a bus master 342, which is adapted to ask every data outbox 314a, 314b, 314c for data. Thus, the data outboxes 314a-c act merely as slave.

The bus master 342 is connected to a clock or counter 344. In an embodiment, the bus master 342 includes a multiplexer. The bus master 342 is adapted to serve one functional block after another. When the bus master 342 reads data from a functional block it samples the data word present in the outbox or the output line and acknowledges successful sampling by issuing a pulse to the respective functional block. This enables the functional block to provide the next data onto the output line or in the output box.

The bus master 342 is adapted to provide the data to the respective functional blocks functions in a similar way one after the other. The bus master 342 includes a memory element, which is adapted to perform the routing with the help of a configurable address generator that defines a target address or target data inbox 316a-c.

Figure 5:
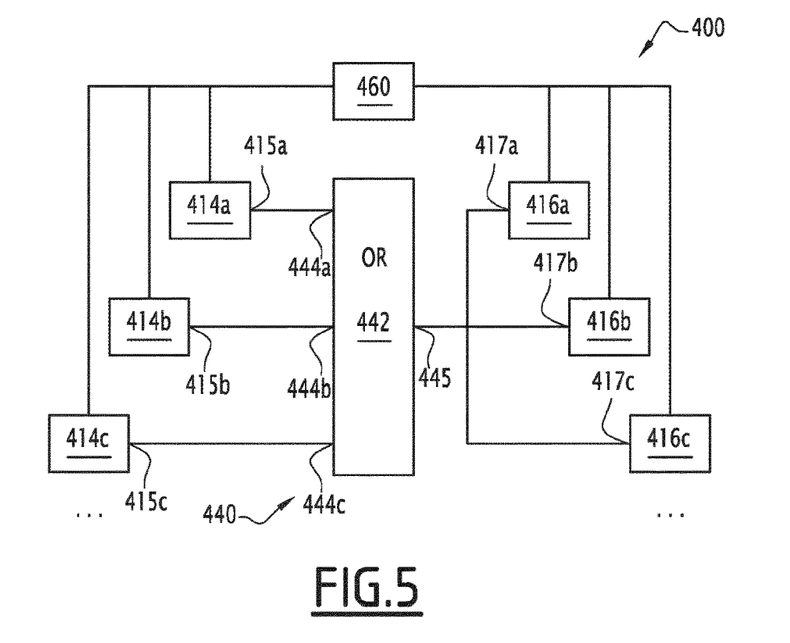
FIG. 5 shows a schematic block diagram of a another embodiment of a data conveyor.
Figure 6:
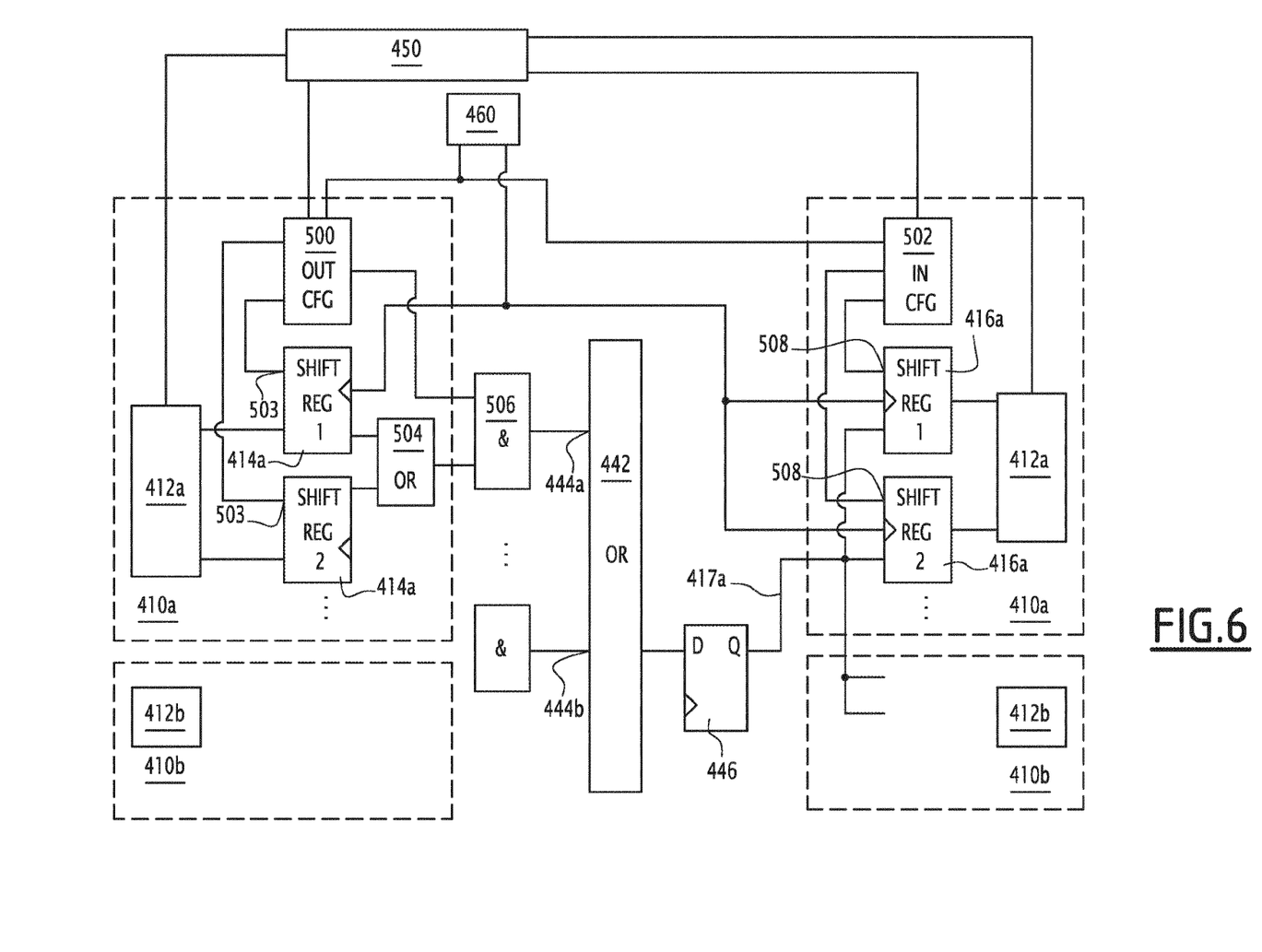
FIG. 6 shows in more detail a schematic block diagram of an embodiment of an FPGA according to the invention using the data conveyor of FIG. 5.

FIGS. 5 and 6 show a schematic block diagram of another FPGA 400 including a second embodiment of a data conveyor 440. The same features are provided with the same reference signs as in FIG. 1 increased by 400 unless designated and described otherwise. The features of embodiment of FIGS. 5 and 6 may be combined with other embodiments disclosed herein. FIG. 6 shows a more detailed view of the FPGA 400. It should be noted that even the input block and the output block are not shown in these figures, they are also connected in a respective way to the data conveyer, the clock and the configuration circuit as the functional blocks. Thus, most of the features described with respect to the functional blocks also apply to the input block and output block.

According to embodiments disclosed herein, the input blocks and output blocks are considered as a specific embodiment of a functional block.

The FPGA 400 includes a plurality of functional blocks, wherein each functional block includes a data outbox 414a, 414b, 414c and a data inbox 416a, 416b, 416c. In other embodiments, the FPGA 300 may include more or less functional blocks. For sake of clarity, the data outboxes 414a, 414b, 414c and the inboxes 416a, 416b, 416c for each functional block are shown separately on the left side and the right side of the figure respectively.

Further, the FPGA 400 includes a clock or counter 460. The clock 460 is connected to every functional block and in particular to the input blocks and the output blocks.

According to the embodiments disclosed herein, the data transmission is realized as a distributed multiplexer structure. In another words, the function of the multiplexer is distributed between different elements of the FPGA, namely a central element and at least one element specific for each functional block, which controls the data to be provided to the central element. The functional block specific elements are connected to the central element. For example, the functions of the multiplexer may be distributed between the data conveyor 440 and the functional blocks.

The data conveyor 440 includes as a central element at least one OR gate 442. The input ports 444a, 444b, 444c of the OR gate 442 are respectively connected to the output ports 415a, 415b, 415c of the respective outboxes 414a-c. An output port 445 of the OR gate 442 is connected to the respective input ports 417a-c of the respective inboxes 416a-c.

In an embodiment, the connections between outboxes 414a-c and the OR gate 442 has a data width of 1 bit. In other embodiments, also other data widths may be used, for example 2 or 3 bits. Accordingly, the connection between the OR gate 442 and the data inboxes 416a-c has the same data width as the connection between the data outboxes 414a-c and the OR gate, for example in this case a data width of 1 bit.

It should be noted that the data conveyor 440 or the central element of the distributed data structure may include several stages of OR gates. For example, after a 20 input OR gate a flip-flop is placed, for example a D-flip flop, after which another OR gate is placed. According to an example, a complete 100 input OR may thus include five 20 input OR gates, five flip-flops or other memory elements, respectively one connected to the output of each OR gate, and one 5 input OR gate. In this case each stage of the OR gates is included in the central element of the distributed multiplexer structure.

If only one input of the OR gate 442 is high, the output is also high. Thus, the outputs of the functional blocks have to be controlled, for example by a functional block specific element of a distributed multiplexer structure.

Each functional block 410a-b, is provided with at least one configuration device 500, 502 (see FIG. 6) for each outbox 414a-c and each inbox 416a-c to control the data provided to the data conveyor or received by the data conveyor. The configuration devices 500, 502 may be seen as function block specific elements of the distributed multiplexer structure.

Figure 7:
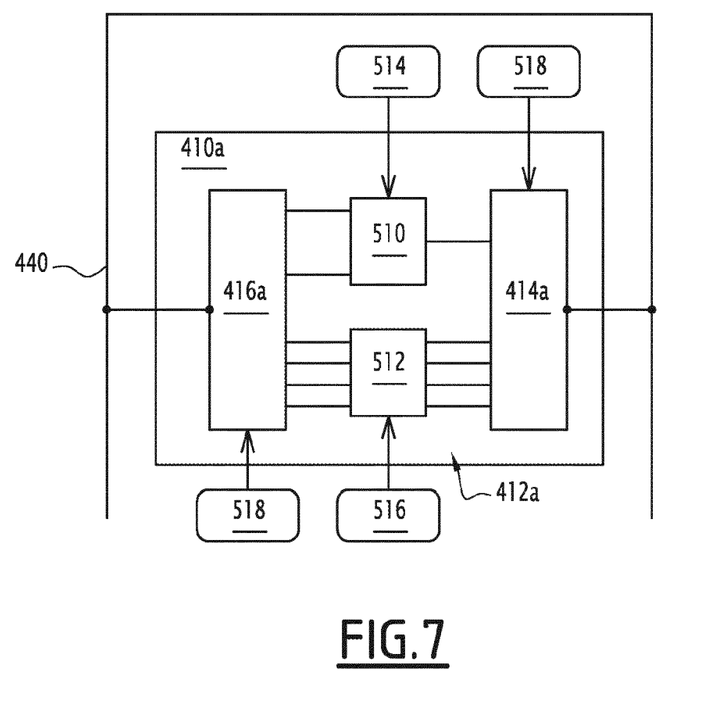
FIG. 7 shows schematically a block diagram of a functional block of an FPGA according to the invention using the data conveyor of FIG. 5.

According to the embodiment shown in FIGS. 5 to 7, the data conveyor 440 is adapted to provide a plurality of time slots. In other words, the communication is split into slots whereas every functional block 410a, 410b knows when it may drive its output during a pre-assigned time slot. If during a time slot the respective source functional block 410a, 410b, wants to signal a low level, it does not drive its output and at the same time no other functional block 410a, 410b considers driving the line. Therefore, the resulting signal after the OR gate 442 remains low. In case the functional block 410a, 410b wants to signal a high level, the output after the OR gate 442 gets high.

The configuration devices 500, 502 and the functions 412a, 412b are configured by the configuration circuit 450. Each configuration device 500, 502 is triggered by the (central) clock or counter 460. The configuration circuit 450 reads cyclically or in regular time intervals an external memory, as shown in FIG. 2, to retrieve the parameters or configuration data. In FIG. 6 only two configuration devices 500, 502 are shown, in particular for the functional block 410a. However, also the other functional blocks, in particular the output block and the input block, include one or more configuration devices.

In particular, the configuration device 500 is adapted to assign for the data stored in each data outbox 414a-c a specific time slot on the data conveyor. Accordingly, the configuration device 502 is adapted to assign for each data inbox 416a a specific time slot to receive input data from the data conveyor 440. In other words, the first configuration device 500 is adapted to control two outboxes 414a of the functional block 410a and the second configuration device 502 is adapted to control the two data inboxes 416a. Thus, both configuration devices 500, 502 may be considered as functional block specific element of the distributed multiplexer structure, as they control the time when the functional block receives form or provides to the data conveyor.

According to an embodiment, the data inboxes 416a-c and the data outboxes 414a-c are shift registers. The shift registers may be written in a parallel way and read in a serial way or vice versa. Thus, the data inboxes 416a-c may provide one bit after the other of the outbox 414a-c to the data conveyor. Further, each data inbox 416a-c and each data outbox 414a-c is triggered by the clock or counter 460.

Further, in case a functional block 410a-b includes more than one data inbox 416a-c and data outbox 414a-c, each data inbox and data outbox 414a-c, 416a-c includes a select input port 503, 508 which defines whether the respective data inbox or outbox is allowed to write data to or receive data from the data conveyor 440. According to an embodiment, the configuration device 500, 502 sets the select input port according to its configuration.

The output of the data outboxes 414a, in particular the shift registers, within a functional block 410a-b are connected to the input ports of an OR gate 504, so that the functional block 410a provides a single output. The output of the OR gate 504 is connected to a first input of an AND gate 506. The second input of the AND gate 506 is driven by the configuration device 500. Thus, the first configuration device 500 is adapted to determine, depending on the clock input, in which time slot of the data conveyor 440 the data stored in each of the data outboxes 414a may be written by enabling one of the two data outboxes 414a via the select input port 503 and by enabling or disabling the output using the AND gate 506. The output of the AND gate 506 is connected as input to the data conveyor 440, in particular the OR gate 442 of the data conveyor 440.

Accordingly, the second configuration device 502 is adapted to determine, depending on the clock input, in which time slot of the data conveyor 440 the data of the data conveyor 440 should be provided to one of the data inboxes 416a by enabling one of the two data outboxes 414a via the select input port 508.

The functional block 410a includes a function 412a which writes a result into the two outboxes 414a. Further, the function 412a reads the data from the two data inboxes 4116a on which the subsequent calculations are performed.

In an embodiment, the data conveyor may further include a memory element 446, which is connected to the output of the OR gate 442. For example, the memory element 446 may be a D-flip-flop.

According to an embodiment, the configuration devices, the data outboxes and the data inboxes, the memory element(s) of the data conveyor are synchronized by a central clock or counter.

In FIG. 7, the functional block 410a is shown in another way compared to FIGS. 5 and 6. The functional block 410 includes only one data inbox 416a and one data outbox 414a. The data inbox 416a is adapted to receive data from the data conveyor 440 and the data outbox 414a is adapted to provide data to the data conveyor 440. The function 412a includes two subfunctions 510, for example a compare function, and 512, for example a sort function. Parameters 514, 516 of the subfunctions 510, 512, for examples a threshold, may be set by the configuration circuit 450. Further, the parameters 518, 520 for multiplexing, for example assigning a time slot on the data conveyor 440, and demultiplexing, for example reading a specific time slot from the data conveyor 440 are also set by the configuration circuit 450 via the configuration devices 500, 502.

In the following the functioning of the FPGA is explained using the functional block 410a. During a calculation phase, the function 412a reads the data from the data inboxes 416a and performs a calculation on the read data. The function 412a then provides the results into the data outboxes 414a.

During the data transfer phase, the configuration device 500 enables at a first predefined time slot or clock value of clock 460 the first data outbox to provide data to the data conveyor 440 or OR gate using the select input port 503 of the first data outbox and the second input port of the AND gate 506. Now, at each clock signal a bit of the first data outbox is provided on the data conveyor 440, in this case the OR gate 442. The configuration devices of the other functional blocks do not allow their respective circuits, for example their shift registers or data outboxes, to write data on the data conveyor 440 during this time slot. Then, during a second predefined time slot or clock value of clock 460, being different to the first predefined time slot, the configuration device 500 enables the second data outbox 414a using the select input port 503 of the second data outbox and the second input port of the AND gate 506. Now, at each clock signal a bit of the second data outbox 414a is provided on the data conveyor 440, in this case the OR gate 442.

Accordingly, during the data transfer phase, the configuration device 502 enables at a third predefined time slot or clock value of clock 460 the first data inbox 416a using the select input port 508 of the first data inbox. Now, at each clock signal a bit of from the data conveyor 440 is written into the first data inbox. At a fourth predefined time slot or clock value of clock 460, being different to the third predefined time slot, the second data inbox 416a is enabled by the configuration device 502 using the select input port 508 of the second data inbox. At each clock signal a bit of from the data conveyor is written into the second data inbox. Thus, both data inboxes are filled with the data from the data conveyor 440.

Thus, according to embodiments disclosed herein, all functional blocks, as well as the input blocks and the output blocks are connected to an OR gate 442 of the data conveyor. The available time for communication is split into time slots which may last for one bit, one byte or even a word. Every such slot is assigned to a clock value of the clock 460. The clock value can be read by all functional blocks, and also the input blocks and output blocks. Thus, the configuration data for each functional block includes at which time slot the block is allowed to provide data to data conveyor. For example, the configuration devices 500, 502 are adapted to compare the current clock or counter value to the configured input or output slots the functional block is allowed to use. This compare signal is adapted to be provided to the second input port of the AND gate 506. The configuration circuits 502 may select in a similar way, at which time slot the data should be read from the data conveyor 440.

According to the embodiments disclosed herein, the functional blocks may be interconnected in an arbitrary way by being able to statically configure for every functional block where to send its output signals to. In other words, if the configuration does not change, the allotted time slots for the respective functional blocks do not change. Thus, during the data transfer phase, the writing into the time slots and respective reading from the time slots is cyclically repeated.

This circuit arrangement allows it to use a very limited amount of configuration data to customize instrumentation and control applications almost as flexible as it can be done by using software based systems while preserving the advantages of FPGA technology.

Thus, the FPGA according to embodiments disclosed herein may be used for programming using a diagram approach for configuring the FPGA.

The invention claimed is:

1. Field programmable gate array comprising:
   plurality of functional blocks at least one of the functional blocks comprising at least one function, at least one of the functions using a parameter, wherein the functional blocks are adapted to perform the at least one function in a calculation phase;
   a data conveyor comprising a plurality of data slots, wherein each functional block is, in a data transfer phase, adapted to receive input data from one or more predefined first slots and/or to provide output data into one or more predefined second slots; and
   a configuration circuit adapted to configure the parameter for the at least function using the parameter and to define the one or more first slots and/or the one or more second slots for at least one functional block, wherein:
   the field programmable gate array is adapted to cyclically repeat the data transfer phase and calculation phase,
   each functional block includes at least one data inbox for the input data and/or at least one data outbox for the output data, and
   the at least one data inbox is an input shift register and the at least one data output is an output shift register.

2. Field programmable gate array according to claim 1, wherein the configuration circuit is adapted to define the one or more first slots and/or the one or more second slots of a plurality of functional blocks.

3. Field programmable gate array according to claim 1, wherein at least one functional block is adapted to receive input data from at least two first slots or to provide output data into at least two second slots, wherein at least two slots of the first slots or the second slots are not adjacent to each other.

4. Field programmable gate array according to claim 1, wherein at least one functional block is adapted to receive as input data output data of at least two functional blocks.

5. Field programmable gate array according to claim 1, wherein the first and/or second slots are time slots, and/or the functional blocks are, in at least two subsequent data transfer phases, for example all data transfer phases, adapted to receiving input data respectively from the same one or more predefined first slots and/or providing output data into respectively the same one or more predefined second slots.

6. Field programmable gate array according to claim 1, wherein the data conveyor includes a multiplexer and/or includes a central element of a distributed multiplexer structure.

7. Field programmable gate array according to claim 1, wherein the data conveyor includes at least one OR gate having a plurality of input ports, wherein the output port of a plurality of a functional blocks is connected to the input ports of the OR gate.

8. Field programmable gate array according to claim 1, wherein at least one function of the functional blocks is adapted to read the at least one input data to perform a task on the at least one input data, and to provide the result of the task as the at least one output data.

9. Field programmable gate array according to claim 1, wherein the at least one function an binary function for binary logic operations, a compare function, a voting function, a calculation function and/or a binary memory.

10. Field programmable gate array according to claim 1, wherein the field programmable gate array is adapted to perform the at least one function of all functional blocks concurrently.

11. Field programmable gate array according to claim 1, wherein at least one functional block is a or are input block(s), wherein each input block is adapted to receive data from devices external to the field programmable gate array and to extract the data for at least one functional block performing a function, and wherein at least one functional block is a or are output block(s) adapted to transform output data from at least one functional block performing a function for devices external to the field programmable gate array.

12. Field programmable gate array according to claim 1, wherein the configuration circuit is adapted to retrieve the configuration data from an external memory being external to the field programmable gate array.

13. Control device for a power plant, wherein the control device includes a field programmable gate array comprising:
plurality of functional blocks at least one of the functional blocks comprising at least one function, at least one of the functions using a parameter, wherein the functional blocks are adapted to perform the at least one function in a calculation phase;
a data conveyor comprising a plurality of data slots, wherein each functional block is, in a data transfer phase, adapted to receive input data from one or more predefined first slots and/or to provide output data into one or more predefined second slots; and
a configuration circuit adapted to configure the parameter for the at least function using the parameter and to define the one or more first slots and/or the one or more second slots for at least one functional block, wherein:
the field programmable gate array is adapted to cyclically repeat the data transfer phase and calculation phase,
each functional block includes at least one data inbox for the input data and/or at least one data outbox for the output data, and
the at least one data inbox is an input shift register and the at least one data output is an output shift register.

14. Control device for a power plant according to claim 13, wherein the power plant is a nuclear power plant.

* * * * *